United States Patent
Huott et al.

(10) Patent No.: US 9,021,328 B2
(45) Date of Patent: Apr. 28, 2015

(54) SHARED ERROR PROTECTION FOR REGISTER BANKS

(71) Applicant: International Business Machines Corporation, Armonk, NY (US)

(72) Inventors: William V. Huott, Holmes, NY (US); Kevin W. Kark, Poughkeepsie, NY (US); John G. Massey, Jericho, VT (US); K. Paul Muller, Wappingers Falls, NY (US); David L. Rude, Wendell, NC (US); David S. Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 13/741,602

(22) Filed: Jan. 15, 2013

(65) Prior Publication Data

US 2014/0201589 A1 Jul. 17, 2014

(51) Int. Cl.
*H03M 13/00* (2006.01)
*H03M 13/29* (2006.01)

(52) U.S. Cl.
CPC .................................. *H03M 13/2909* (2013.01)

(58) Field of Classification Search
CPC ............ H03M 13/2957; H03M 13/29; H03M 13/1515; H03M 13/2909; G11B 20/1833
USPC ......................................................... 714/755
See application file for complete search history.

(56) References Cited

U.S. PATENT DOCUMENTS

| | | |
|---|---|---|
| 3,789,372 A | 1/1974 | Lejon |
| 4,297,598 A | 10/1981 | Smith |
| 4,375,600 A | 3/1983 | Wu |
| 4,464,752 A | 8/1984 | Schroeder et al. |
| 4,653,050 A | 3/1987 | Vaillancourt |
| 4,883,991 A | 11/1989 | Kroner et al. |
| 4,901,320 A | 2/1990 | Sawada et al. |
| 5,012,472 A | 4/1991 | Arimoto et al. |
| 5,164,944 A | 11/1992 | Benton et al. |
| 5,172,339 A | 12/1992 | Noguchi et al. |
| 5,450,424 A | 9/1995 | Okugaki et al. |

(Continued)

FOREIGN PATENT DOCUMENTS

JP 2008-217926 9/2008

OTHER PUBLICATIONS

Dutta et al., "Multiple Bit Upset Tolerant Memory Using a Selective Cycle Avoidance Based SEC-DED-DAEC Code", Computer Engineering Research Center, 25th IEEE VLSI Test Symposium (VTS'07), 2007, pp. 349-354.

(Continued)

*Primary Examiner* — Albert DeCady
*Assistant Examiner* — Enam Ahmed
(74) *Attorney, Agent, or Firm* — Cantor Colburn LLP; Margaret McNamara

(57) ABSTRACT

A method for adding error detection, or error detection combined with error correction, to a plurality of register banks includes grouping the plurality of register banks into an array. The method also includes adding a first error control mechanism to the array in a first direction and adding a second error control mechanism to the array in a second direction. The method further includes adding a product code to the array, the product code including applying the second error control mechanism to a plurality of bits of the first error control mechanism.

11 Claims, 9 Drawing Sheets

(56) References Cited

U.S. PATENT DOCUMENTS

| | | | |
|---|---|---|---|
| 5,457,702 A | 10/1995 | Williams et al. | |
| 5,592,499 A | 1/1997 | Tanoi | |
| 5,650,977 A * | 7/1997 | Kyung et al. | 365/230.03 |
| 5,784,391 A | 7/1998 | Konigsburg | |
| 5,787,493 A | 7/1998 | Niijima et al. | |
| 5,845,071 A | 12/1998 | Patrick et al. | |
| 6,392,945 B2 | 5/2002 | Sato | |
| 6,397,364 B1 | 5/2002 | Barkan | |
| 6,459,624 B1 | 10/2002 | Kuo | |
| 6,838,899 B2 | 1/2005 | Plants | |
| 6,900,999 B1 | 5/2005 | Yen et al. | |
| 6,928,590 B2 | 8/2005 | Ilkbahar et al. | |
| 7,093,208 B2 | 8/2006 | Williams et al. | |
| 7,110,275 B2 | 9/2006 | Park | |
| 7,143,332 B1 | 11/2006 | Trimberger | |
| 7,237,175 B2 | 6/2007 | Hatakenaka et al. | |
| 7,339,816 B1 | 3/2008 | Dastidar | |
| 7,346,829 B2 | 3/2008 | Riho et al. | |
| 7,350,160 B2 | 3/2008 | Perez et al. | |
| 7,350,174 B2 | 3/2008 | Srinivasan et al. | |
| 7,365,432 B2 | 4/2008 | Liaw | |
| 7,389,446 B2 | 6/2008 | Krasnansky | |
| 7,397,887 B2 | 7/2008 | Kuhn | |
| 7,430,703 B1 | 9/2008 | Schultz | |
| 7,461,366 B2 | 12/2008 | Gaul | |
| 7,512,921 B2 | 3/2009 | Shibuya | |
| 7,523,380 B1 | 4/2009 | Trimberger | |
| 7,529,986 B2 | 5/2009 | Riho et al. | |
| 7,539,926 B1 | 5/2009 | Lesea | |
| 7,574,648 B2 | 8/2009 | Akiyama et al. | |
| 7,596,732 B2 * | 9/2009 | Branch et al. | 714/726 |
| 7,603,592 B2 | 10/2009 | Sekiguchi et al. | |
| 7,606,111 B2 | 10/2009 | Lee et al. | |
| 7,638,822 B1 | 12/2009 | de Jong et al. | |
| 7,770,075 B2 | 8/2010 | Kondajeri et al. | |
| 7,795,900 B1 | 9/2010 | Lesea et al. | |
| 7,945,825 B2 | 5/2011 | Cohen et al. | |
| 7,966,547 B2 | 6/2011 | Lam | |
| 7,975,200 B2 * | 7/2011 | Mead | 714/752 |
| 8,006,166 B2 | 8/2011 | Roohparvar et al. | |
| 8,010,755 B2 | 8/2011 | Murin | |
| 8,042,071 B2 | 10/2011 | Moyer et al. | |
| 8,051,358 B2 | 11/2011 | Radke | |
| 8,069,307 B2 | 11/2011 | Cornwell et al. | |
| 8,069,392 B1 | 11/2011 | Norrie | |
| 8,069,393 B2 | 11/2011 | Eroz et al. | |
| 8,099,688 B2 | 1/2012 | Ellis et al. | |
| 8,108,822 B2 | 1/2012 | Voldman | |
| 8,151,173 B2 | 4/2012 | Hirose et al. | |
| 8,171,380 B2 | 5/2012 | Yang et al. | |
| 8,245,100 B2 | 8/2012 | Radke | |
| 8,276,046 B2 | 9/2012 | Song et al. | |
| 8,370,710 B2 | 2/2013 | Kim et al. | |
| 8,429,492 B2 | 4/2013 | Yoon et al. | |
| 8,516,339 B1 * | 8/2013 | Lesea et al. | 714/763 |
| 8,560,931 B2 | 10/2013 | Seshadri et al. | |
| 8,661,317 B2 | 2/2014 | Jeon et al. | |
| 8,713,411 B2 | 4/2014 | Kong et al. | |
| 2002/0038440 A1 | 3/2002 | Barkan | |
| 2002/0147995 A1 | 10/2002 | Kim et al. | |
| 2003/0237069 A1 | 12/2003 | Mohan et al. | |
| 2006/0200727 A1 | 9/2006 | Akiyama et al. | |
| 2006/0259850 A1 * | 11/2006 | Tomisawa | 714/793 |
| 2008/0034269 A1 * | 2/2008 | Hwang et al. | 714/756 |
| 2008/0034272 A1 | 2/2008 | Wu et al. | |
| 2008/0313493 A1 | 12/2008 | Roohparvar et al. | |
| 2009/0006923 A1 | 1/2009 | Gara et al. | |
| 2009/0201748 A1 | 8/2009 | Muraki | |
| 2009/0241073 A1 | 9/2009 | Ellavsky et al. | |
| 2010/0025761 A1 | 2/2010 | Voldman | |
| 2010/0251076 A1 | 9/2010 | Wu et al. | |
| 2011/0088008 A1 | 4/2011 | Fifield et al. | |
| 2011/0131472 A1 | 6/2011 | Antonakopoulos et al. | |
| 2011/0185257 A1 | 7/2011 | Vogelsang | |
| 2011/0239093 A1 | 9/2011 | Radke | |
| 2011/0309856 A1 | 12/2011 | Cabanas-Holmen et al. | |
| 2012/0096330 A1 * | 4/2012 | Przybylski | 714/763 |
| 2012/0278676 A1 | 11/2012 | Teraura | |
| 2013/0179754 A1 | 7/2013 | Cherubini et al. | |
| 2014/0197863 A1 | 7/2014 | Huott et al. | |
| 2014/0201606 A1 | 7/2014 | Huott et al. | |
| 2014/0208184 A1 | 7/2014 | Huott et al. | |

OTHER PUBLICATIONS

Kishani et al., "HVD: horizontal-vertical-diagonal error detecting and correcting code to protect against with soft errors", Des Autom Embed Syst (2011) 15; pp. 289-310.

Mehrara, et al., "Reliability-Aware Data Placement for Partial Memory Protection in Embedded Processors", MSPC 06, Proceedings of the 2006 workshop on Memory system performance and correctness, 2006 ACM Sigplan, Oct. 22, 2006, Advanced Computer Architecture Lab, University of Michigan, pp. 11-18.

Shamshiri et al., "rror-Locality-Aware Linear Coding to Correct Multi-bit Upsets in SRAMs", International Test Conference, Paper 7.1, 2010 IEEE International, pp. 1-10.

Yao, et al., "Design and Experimental vAlidation of Radiation Hardene by Design SRAM Cells", IEEE Transactions on Nuclear Science, vol. 57, No. 1, Feb. 2010; pp. 253-265.

Bhattacharya, et al., "A Framework for Correction of Multi Bit Soft Errors in L2 Caches Based on Redundancy", IEEE Transactions on Very Large Scale Integration (VLSI) Systems, vol. 17, Issue: 2, 2009, pp. 194-206.

English Translation and Abstract for Japanese Application JP2008217926, published Sep. 18, 2008.

* cited by examiner

SHARED ERROR PROTECTION FOR REGISTER BANKS

CROSS REFERENCE TO RELATED APPLICATIONS

This application is related to the following U.S. patent applications which were filed concurrently herewith, each of which is hereby incorporated by reference: U.S. patent application Ser. No. 13/741,599; filed Jan. 15, 2013; U.S. patent application Ser. No. 13/741,600 filed Jan. 15, 2014; U.S. patent application Ser. No. 13/741,600; filed Jan. 15, 2013; and U.S. patent application Ser. No. 13/741,603; filed Jan. 15, 2013.

BACKGROUND

The present invention relates to error protection for integrated circuits, and more specifically, to shared error protection for integrated circuits including a plurality of register banks.

As integrated circuits continue to be made smaller many new dependability issues are becoming increasingly important. For example, as the size of integrated circuits becomes smaller, radiation-induced faults, such as single-event upsets (SEUs) and multi-bit upsets (MBUs), are becoming more common. An SEU or MBU can occur when a particle passes through an integrated circuit. The particles may convert their kinetic energy to electrical energy which can be deposited in the circuitry. This energy can affect the state of the circuitry, for example flipping a bit, if the deposited energy exceeds the energy level which is required to hold the correct state. An SEU occurs when a particle changes the state of a single circuit element and an MBU occurs when a particle changes the state of two or more circuit elements. Cosmic rays and other common radiation types can result in SEUs and MBUs in integrated circuits. Indeed, as integrated circuits continue to decrease in size, lower energies are needed to change the internal state of the circuitry. Therefore, radiation-induced faults are becoming an increased reliability concern for modern integrated circuits.

Currently, error protection for integrated circuits does not consider the configuration of the register bank or its proximity to other register banks on the same integrated circuit. Accordingly, current error protection techniques for register banks are often incapable of detecting a MBU.

SUMMARY

According to an exemplary embodiment, a method for providing error detection, or error detection combined with error correction, to a plurality of register banks includes grouping the plurality of register banks into an array. The method also includes adding a first error control mechanism to the array in a first direction and adding a second error control mechanism to the array in a second direction. The method further includes adding a product code to the array, the product code including applying the second error control mechanism to a plurality of bits of the first error control mechanism.

According to another exemplary embodiment, a computer system for providing error detection, or error detection combined with error correction, to a plurality of register banks, the computer system comprising a processor, the computer system configured to perform a method. The method includes grouping the plurality of register banks into an array. The method also includes adding a first error control mechanism to the array in a first direction and adding a second error control mechanism to the array in a second direction. The method further includes adding a product code to the array, the product code including applying the second error control mechanism to a plurality of bits of the first error control mechanism.

According to another exemplary embodiment, a system includes a plurality of register banks grouped in an array, where each register bank includes a plurality of registers. The system also includes a first error control mechanism configured to detect or correct errors in the array in a first direction and a second error control mechanism configured to detect or correct errors in the array in a second direction. The system further includes a product code configured to apply the second error control mechanism to a plurality of bits of the first error control mechanism.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
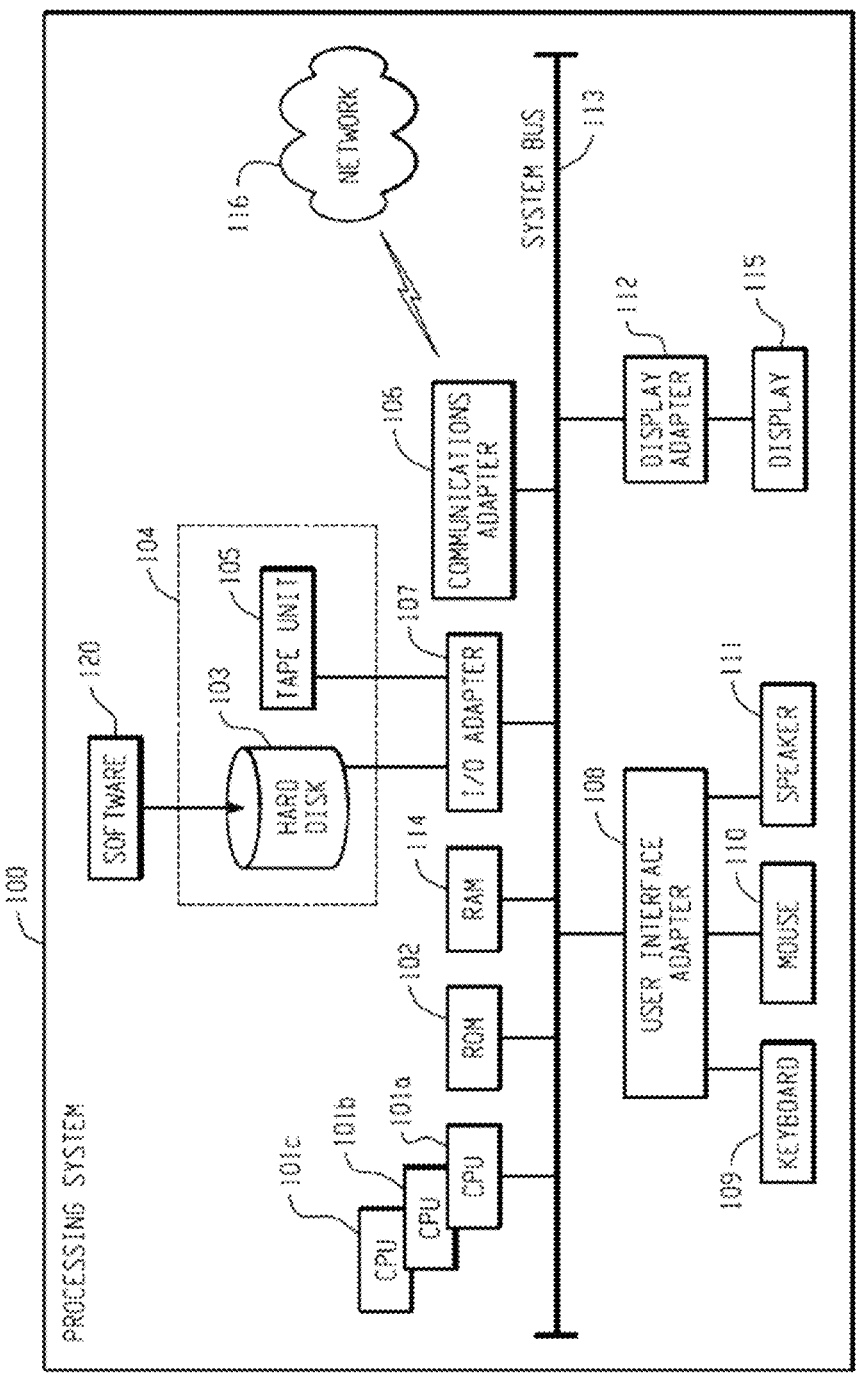
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, a direct access storage device or hard disk 103, and tape storage device 105 are collectively referred to herein as mass storage 104. A network adapter 106 interconnects bus 113 with an outside network 116 enabling data processing system 100 to communicate with other such systems and external storage devices. A screen (e.g., a display monitor) 115 is connected to system bus 113 by display adapter 112, which may include a graphics adapter to improve the performance of graphics intensive applications and a video controller. In one embodiment, adapters 107, 106, and 112 may be connected to one or more I/O buses that are connected to system bus 113 via an intermediate bus bridge (not shown). Suitable I/O buses for connecting peripheral devices such as hard disk controllers, network adapters, and graphics adapters typically include common protocols, such as the Peripheral Components Interface (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system such as the z/OS® operating system from IBM Corporation to coordinate the functions of the various components shown in FIG. 1.

Examples of operating systems that may be supported by the system 100 include Windows 95, Windows 98, Windows NT 4.0, Windows XP, Windows 2000, Windows CE, Windows Vista, Macintosh, Java, LINUX, and UNIX, z/OS or any other suitable operating system. The system 100 also includes a network interface 116 for communicating over a network. The network can be a local-area network (LAN), a metro-area network (MAN), or wide-area network (WAN), such as the Internet or World Wide Web. Users of the system 100 can connect to the network through any suitable network interface 116 connection, such as standard telephone lines, digital subscriber line, LAN or WAN links (e.g., T1, T3), broadband connections (Frame Relay, ATM), and wireless connections (e.g., 802.11a, 802.11b, 802.11g).

As disclosed herein, the system 100 includes machine readable instructions stored on machine readable media (for example, the hard disk 104) for capture and interactive display of information shown on the screen 115 of a user. As discussed herein, the instructions are referred to as "software" 120. The software 120 may be produced using software development tools as are known in the art. Also discussed herein, the software 120 may also referred to as a "command line testing tool" 120, an "a testing interface" 120 or by other similar terms. The software 120 may include various tools and features for providing user interaction capabilities as are known in the art. The software 120 can include a database management subsystem such as DB2®, which manages structured data access requests and queries from end users and applications.

Figure 2:
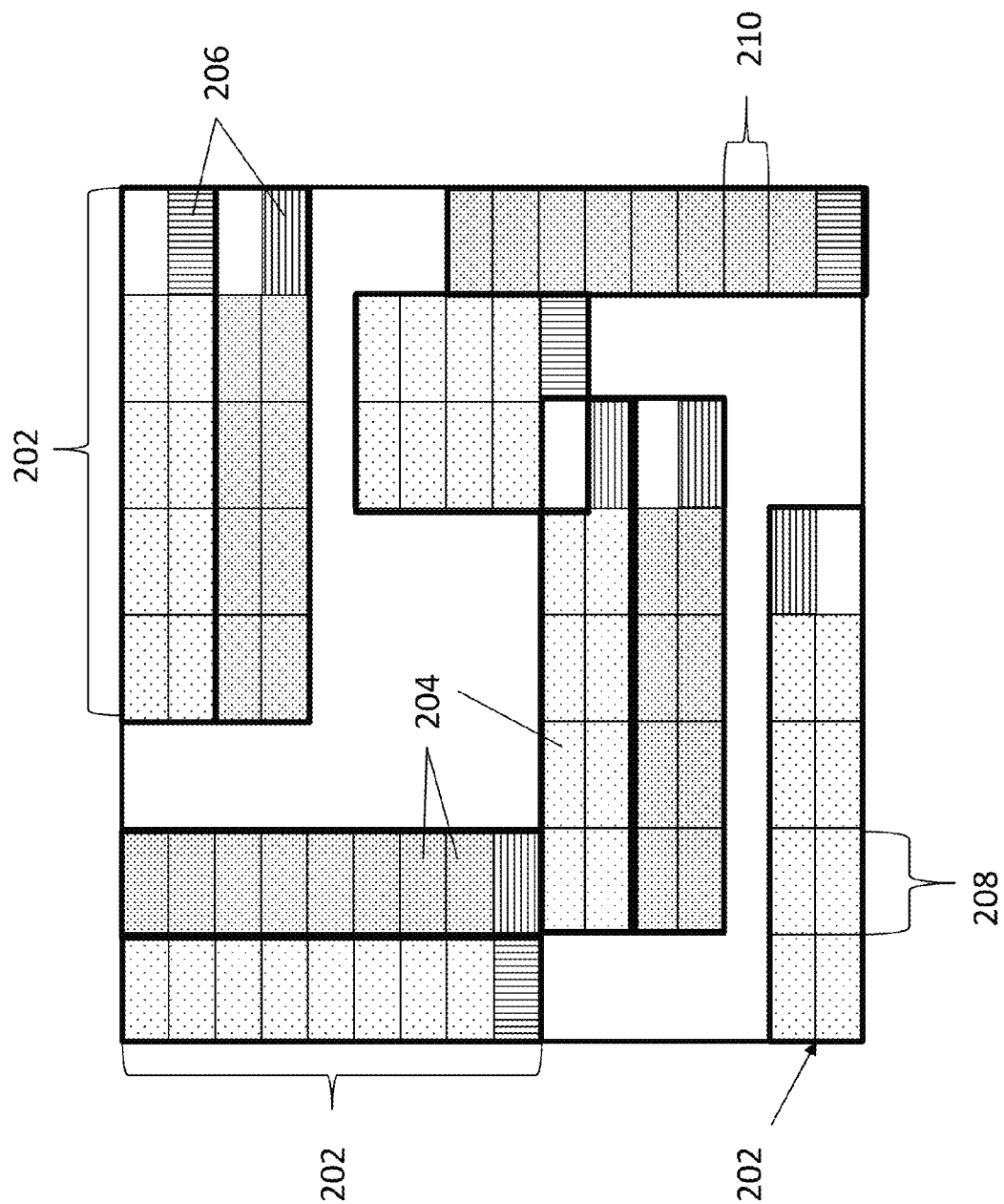
FIG. 2 is a schematic diagram illustrating a conventional configuration of a plurality of register banks.

Referring now to FIG. 2, a schematic diagram illustrating a conventional configuration of a plurality of register banks 202 is shown. As will be understand by those of ordinary skill in the art, the register bank configuration illustrated in FIG. 2 is for exemplary purposes only and the number of bits in the register bank and the number of parity bits may vary. The register banks 202 each include a plurality of registers 204 and a parity protection bit 206. As illustrated, the register banks 202 can be configured in a wide variety of configurations. For example, the registers 204 of the register banks 202 can be disposed in a single column or across multiple columns. As shown, each of the registers 204 has a length 208 and a width 210, which is less than the length 208.

Figure 3:
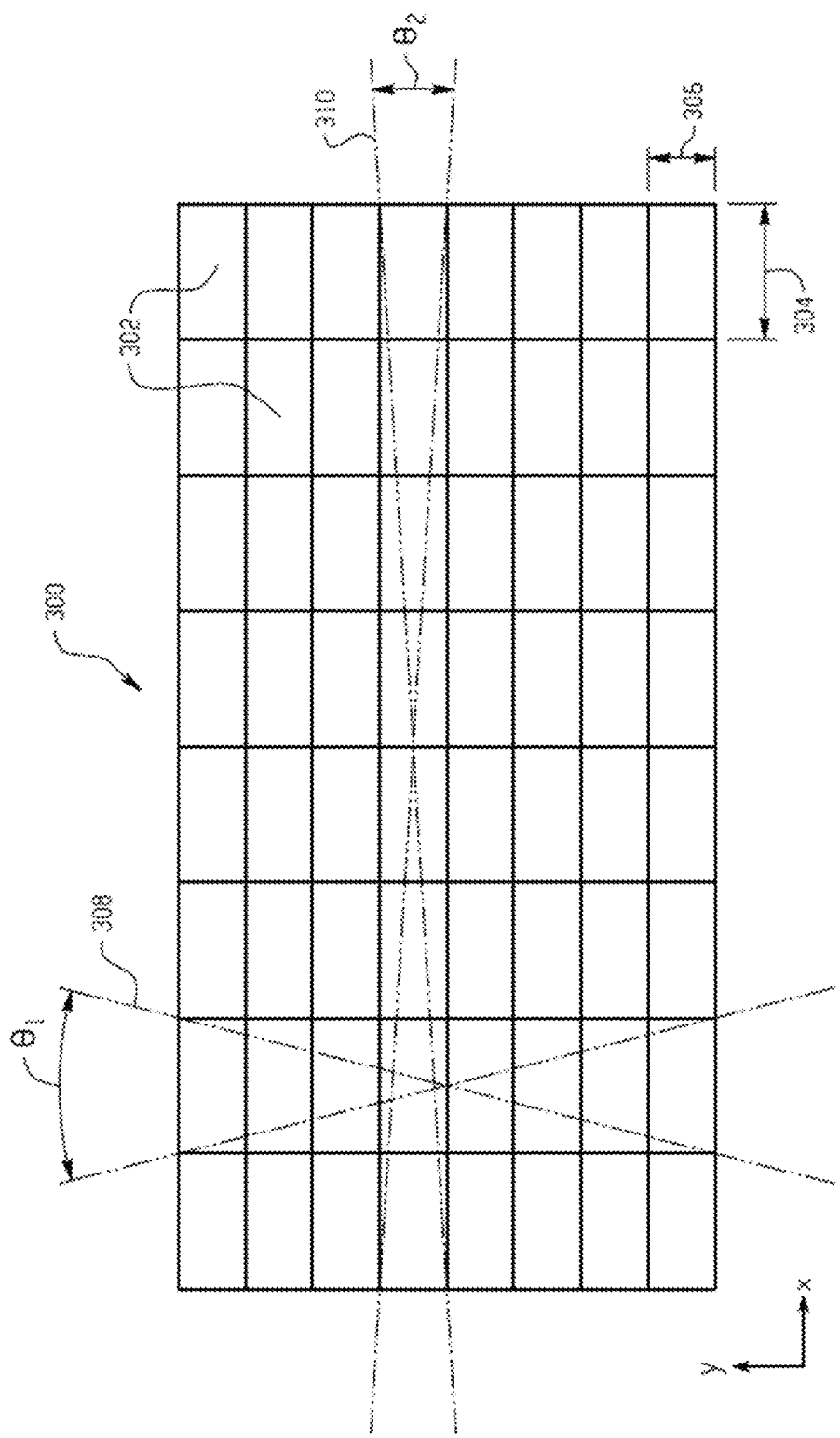
FIG. 3 is a schematic illustrating an array of storage cells in accordance with the disclosure.

FIG. 3 is a schematic illustrating a two dimensional array 300 of storage cells (such as registers) 302. It will be appreciated by those of ordinary skill in the art that the configuration of the storage cells 302 in the array 300 illustrated is one of several possible configurations and that the configuration illustrated is not intended to be limiting in any way.

During operation of the array 300 of storage cells 302 a particle, or particle beam 308, 310, can impact two or more storage cells 302 thereby causing a multi-bit upset ("MBU"). Due to the dimensions of the gates of storage cells 302, particularly the difference between a length 304 and a width 306 of the gates, a particle, or particle beam 308, traveling generally in the y-direction has a much higher likelihood of impacting a plurality of storage cells 302 and causing a MBU as compared to a particle, or particle beam 310, traveling generally in the x-direction. In exemplary embodiments, the range of the angles that a particle or particle beam 308 can strike the storage cells gates in the array 300 in the y-direction and cause a MBU can be represented by $\Theta_1$ and the range of the angles that a particle or particle beam 310 can strike the storage cells gates in the array 300 in the x-direction and cause a MBU can be represented by $\Theta_2$. In exemplary embodiments, when the length 304 of the gates of the storage cells 302 is greater than the width 306 of the gates of the storage cells 302, $\Theta_1$ will be greater than $\Theta_2$. In addition, the probability that a particle will cause a MBU in a given direction, for example the y-direction, is proportional to the range of the angles, for example $\Theta_1$. The different probabilities of MBUs in each direction may be further compounded by the difference in length and width of the gate conductors, which may have length-width ratios larger than 10.

Since the likelihood of experiencing a MBU due to a particle beam in the y-direction is higher than in the x-direction, the y-direction is referred as a sensitive direction of the array 300 and the x-direction is referred to as an insensitive direction of the array 300. In exemplary embodiments, the sensitive direction of the array 300 of storage cells 302 can be defined as being perpendicular to the length 304 of storage cell gates and the insensitive direction of the array 300 of storage cells 302 can be defined as being perpendicular to the width 306 of the storage cell gates.

Figure 4A:
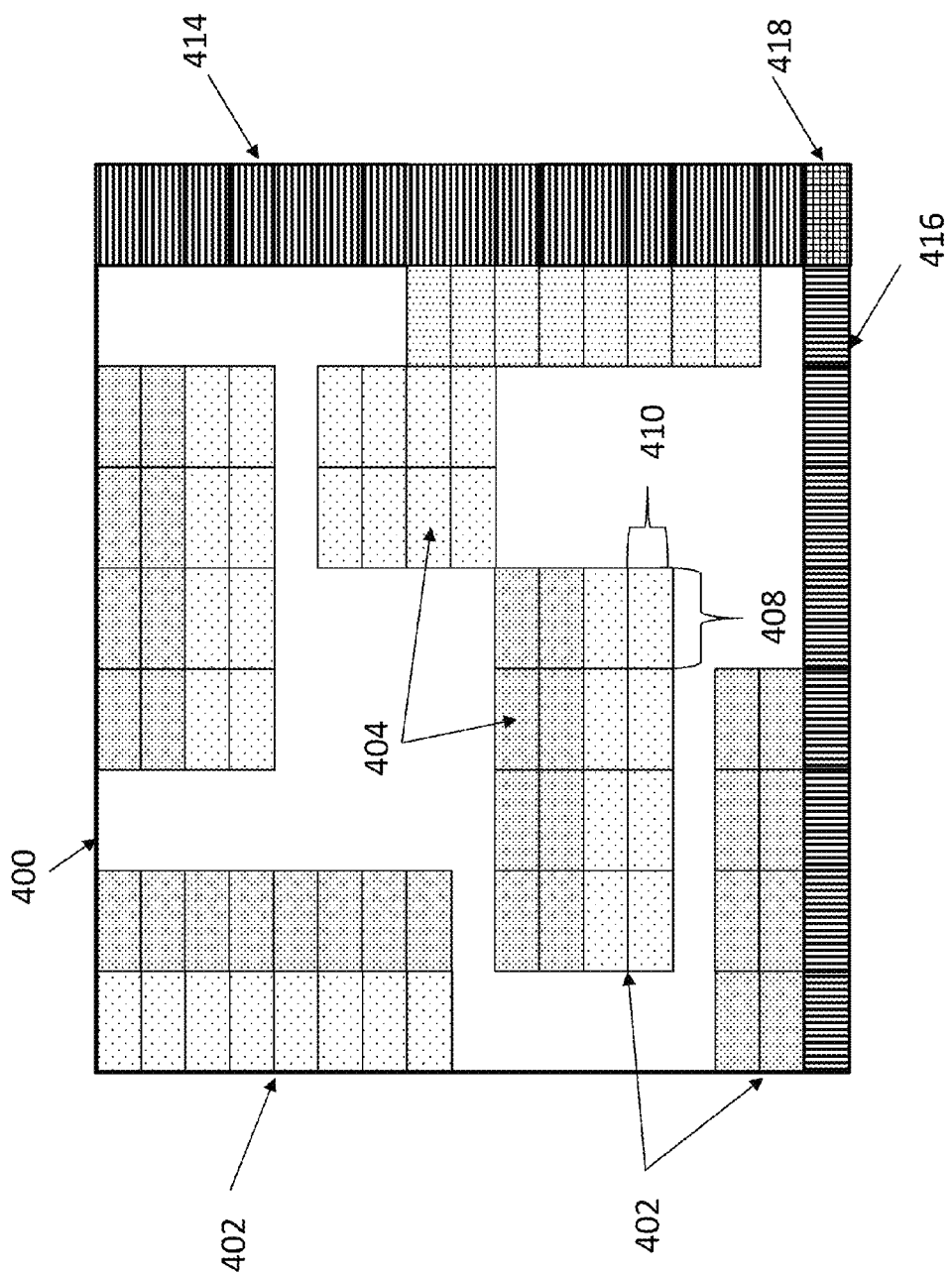
FIGS. 4A-D are a schematic illustrating a configuration of a plurality of register banks with in accordance with the disclosure.

Referring now to FIG. 4A, a plurality of register banks 402 grouped into an array 400 is shown. Each of the plurality of register banks 402 includes a plurality of registers 404 that have a length 408 and a width 410, which may be less than the length 408. The array 400 includes one or more error control mechanisms that are configured to provide error detection or correction to the plurality of registers 404 of the register banks 402. In exemplary embodiments, the array 400 includes a first error control mechanism 414 and a second error control mechanism 416, which are each configured to provide error protection to one or more registers 404 of the register banks 402. In exemplary embodiments, the first error control mechanism 414 may be configured to detect or correct errors that occur to one or more registers 404 disposed in a first, or insensitive, direction. Likewise, the second error control mechanism 416 may be configured to detect or correct errors that occur to one or more registers 404 disposed in a second, or sensitive, direction. In exemplary embodiments, the array 400 may also include a product code 418, which may be the second error control mechanism 416 applied to the bits of the first error control mechanism 414 or the first error control mechanism 414 applied to the bits of the second error control mechanism 416.

In exemplary embodiments, depending upon the application and the level of error detection and/or protection desired, the first error control mechanism 414 and/or second error control mechanism 416 may include a parity protection bit, an error control coding ("ECC") circuit, or another form of error detection and correction. In general, parity protection provides single-bit error detection, but provides no way to correct detected errors. Advanced error detection and correction protocols, such as single-error correction double-error detection (SECDED) codes, are capable of detecting both single-bit and multi-bit errors and correcting single-bit errors. These codes use a special algorithm to encode information in a block of bits that contains sufficient detail to permit the recovery of a single-bit error in the data. Unlike parity protection, which uses a single bit to provide protection to eight bits, ECC uses larger groupings, such as 7 bits to protect 32 bits, or 8 bits to protect 64 bits. In general, the strength of an error detection mechanism is represented by the Hamming distance of the error detection mechanism, which is the minimum number of binary digits that differ between any two codewords in the code.

In exemplary embodiments, by using a first error control mechanism 414 and a second error control mechanism 416 to detect or correct errors for the plurality of registers banks 402 configured in an array 400, compared with using parity protection for each register bank 402, the effectiveness of the error protection resources can be optimized. For example, by using first error control mechanism 414 multiple errors in registers 404 of single register banks 402 can be detected or corrected. In addition, by using a product code 418 multiple errors in adjacent registers 404 of different register banks 402 can also be detected or corrected.

Figure 4B:
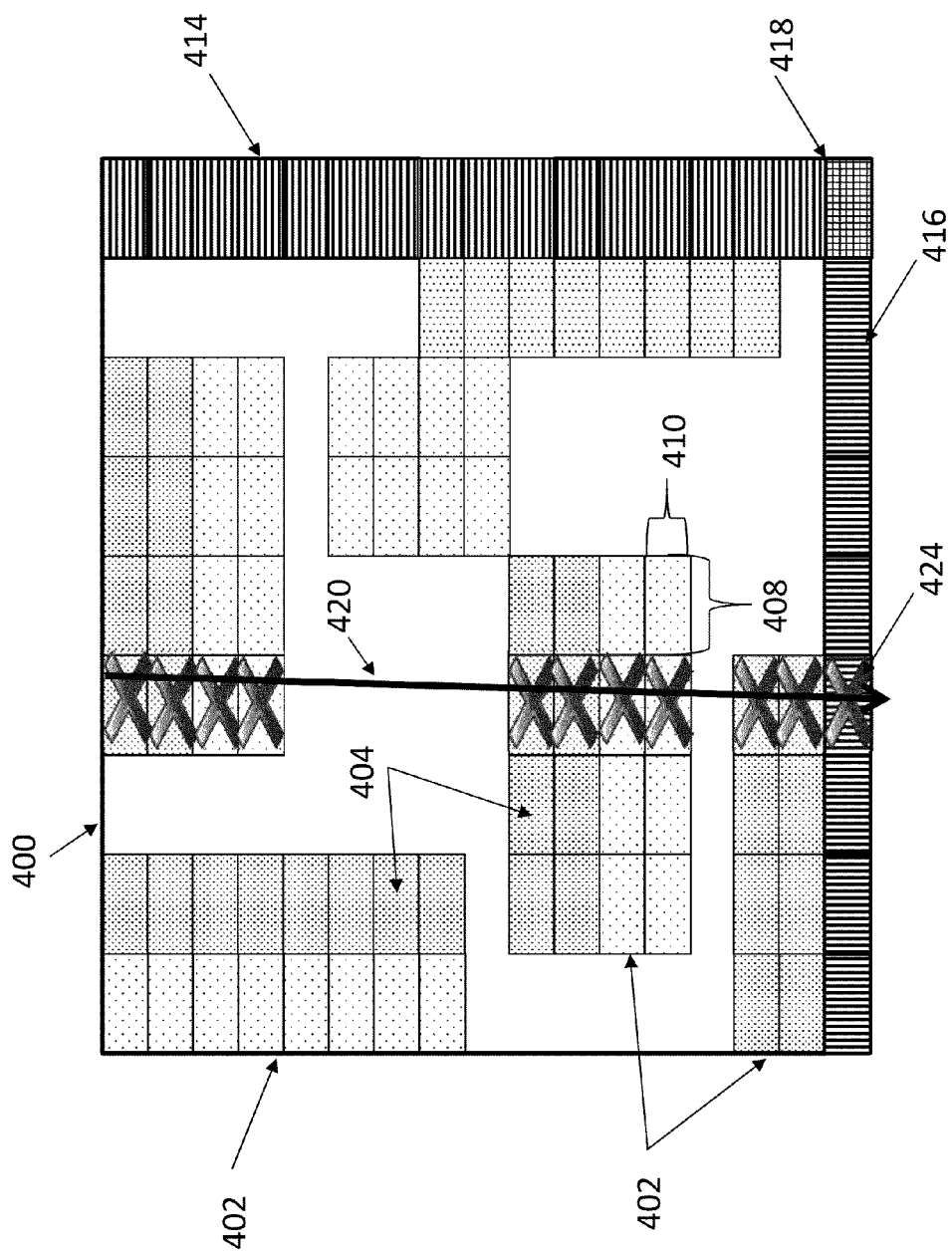

In one example, as illustrated in FIG. 4B, a particle, or beam, 420 may impact and cause errors in multiple registers 404 of multiple register banks 402. As illustrated, the first error control mechanism 414 will be able to detect each of these errors, even if the first error control mechanism 414 only provides parity protection. For comparison, if the same particle struck the register configuration shown in FIG. 2, the parity protection of the register banks 202 would not be capable of detecting any of these errors. In addition, the product code 418 may be able to detect the error 424 caused by the particle in the second error control mechanism 416.

Figure 4C:
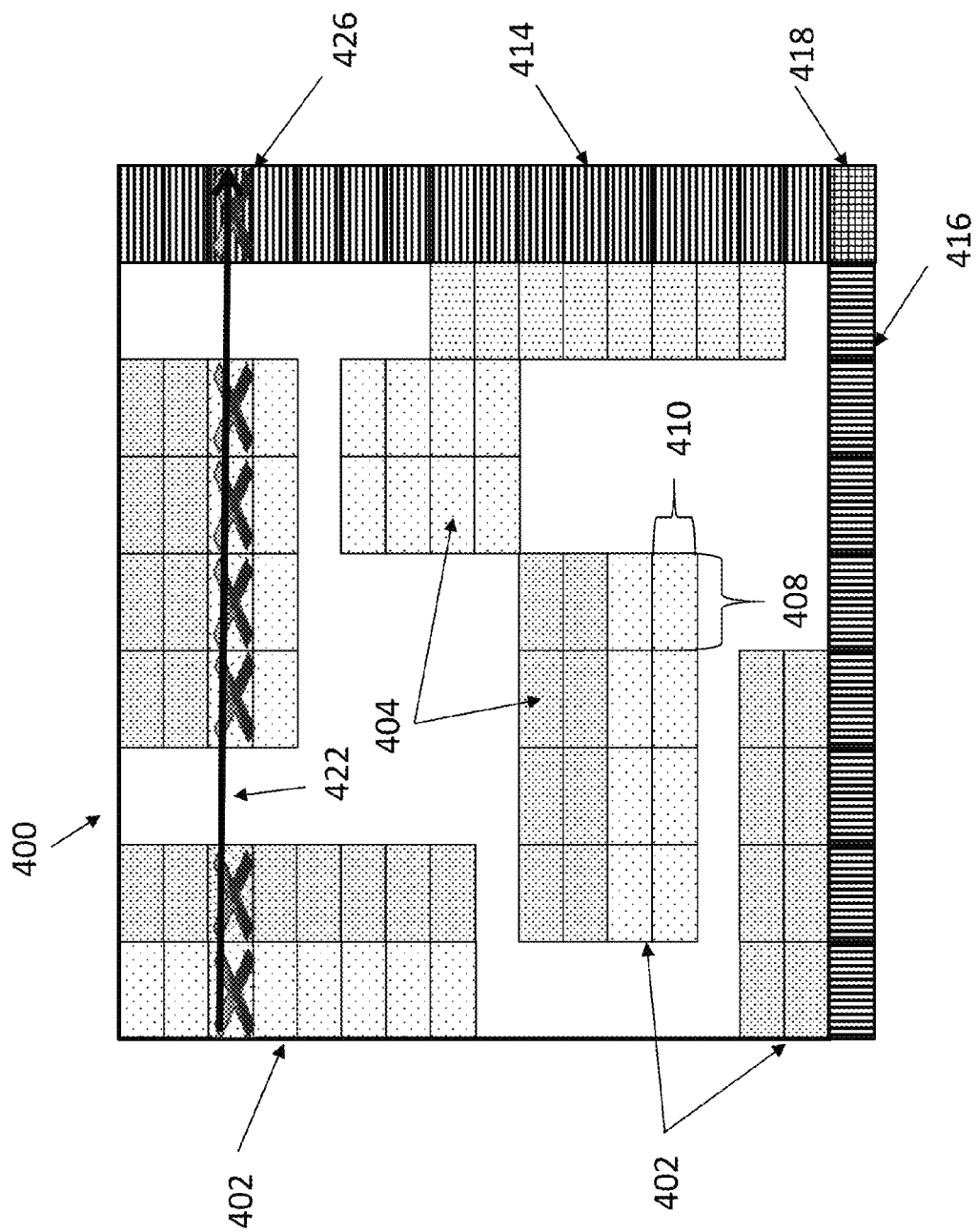

In another example, as illustrated in FIG. 4C, a particle, or beam, 422 may impact and cause errors in multiple registers 404 of multiple register banks 402. As illustrated, the second error control mechanism 416 will be able to detect each of these errors, even if the second error control mechanism 416 only provides parity protection. For comparison, if the same energy particle struck the register configuration shown in FIG. 2, the parity protection of the register banks 202 would not be capable of detecting all of these errors. Rather, the parity protection illustrated in FIG. 2 would only be capable of detecting two of the six errors. In addition, the product code 418 may be able to detect the error 426 caused by the particle in the first error detection mechanism 414.

Figure 4D:
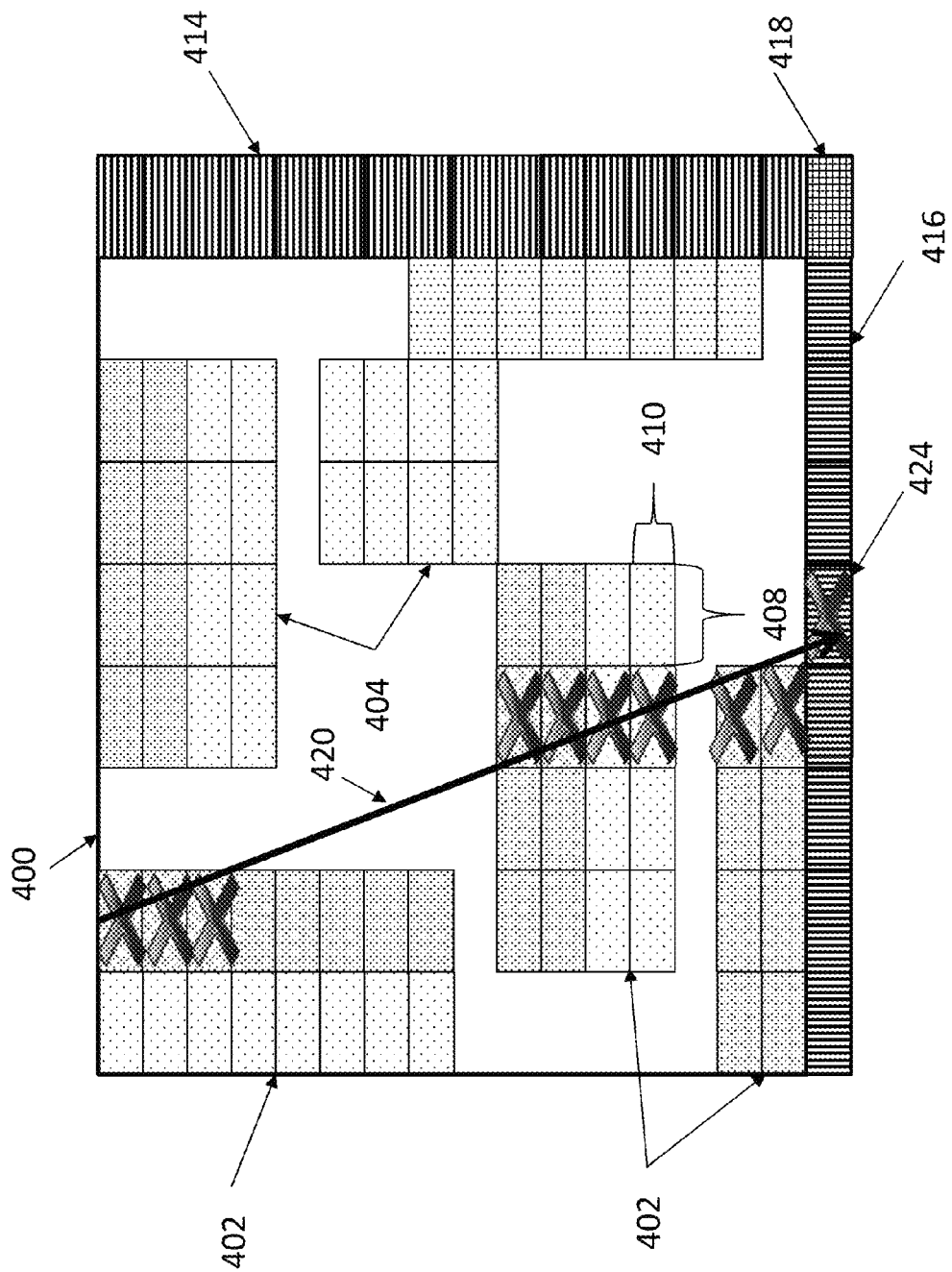

In yet another example, as illustrated in FIG. 4D, a particle, or beam, 420 may impact and cause errors in multiple registers 404 of multiple register banks 402. As illustrated, the first error control mechanism 414 will be able to detect each of these errors, even if the first error control mechanism 414 only provides parity protection. For comparison, if the same particle struck the register configuration shown in FIG. 2, the parity protection of the register banks 202 would not be capable of detecting all of these errors. In addition, the product code 418 may be able to detect the error 424 cause by the particle in the second error control mechanism 416.

Figure 5:
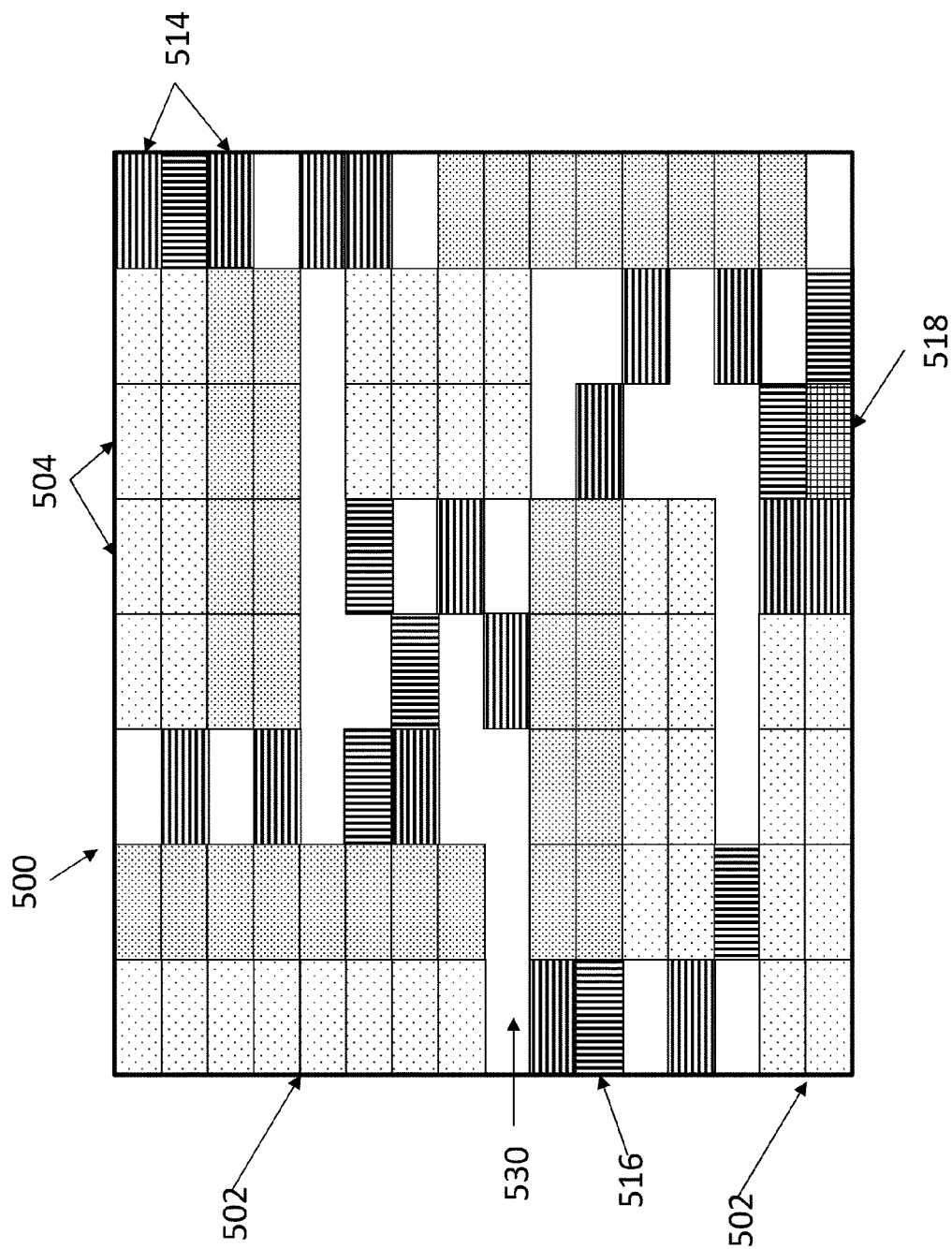
FIG. 5 is a schematic illustrating a configuration of a plurality of register banks with in accordance with the disclosure.

Referring now to FIG. 5, a plurality of register banks 502 grouped into an array 500 is shown. As illustrated the array 500 includes a similar configuration of register banks 502 as shown in FIGS. 4A-4D, however, the bits that make up the first error control mechanism 514, the second error control mechanism 516 and the product code 518 have been relocated to occupy a free space 530 between the register banks 502 of the array 500. By placing the bits of the first error control mechanism 514, the second error control mechanism 516 and the product code 518 in the free space 530 between the register banks 502 of the array 500 the size of the array 500 can be decreased without reducing the effectiveness of the error protection or requiring additional resources to provide error protection to the array 500.

In one embodiment, both the first error control mechanism and second error control mechanism may be parity protection. In exemplary embodiments, the error control mechanism in the sensitive direction can be selected to be stronger than the error control mechanism in the insensitive direction. By applying a stronger error control mechanism for the sensitive direction and a weaker error control mechanism for the insensitive direction the overall reliability and speed of the combined error protection is increased and the use of the available error control resources can be optimized without negatively impacting performance.

Figure 6:
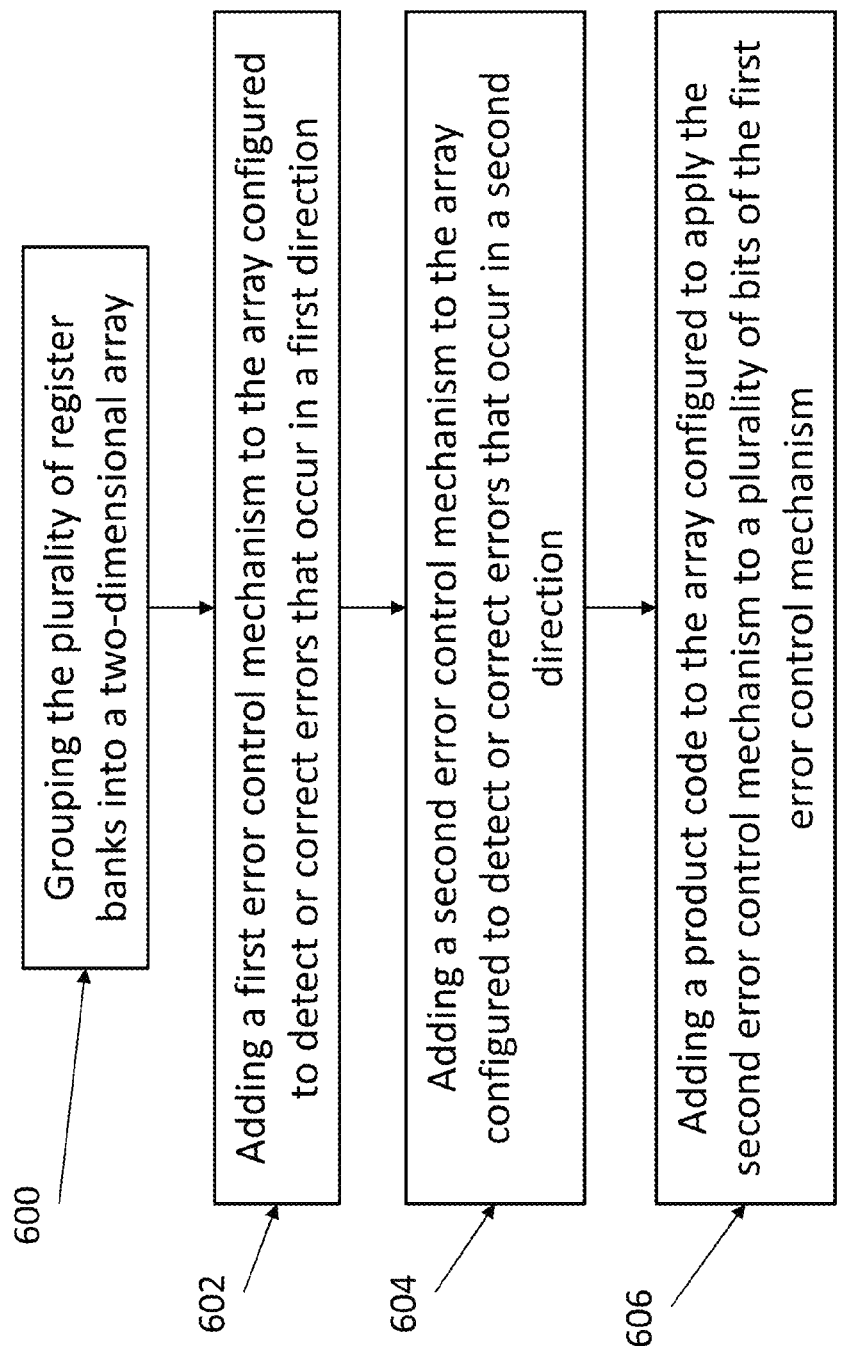
FIG. 6 is a flow diagram that illustrates a method for providing error control to a plurality of register banks in accordance with an exemplary embodiment.

Referring now to FIG. 6, a flow diagram that illustrates a method for providing error control to a plurality of register banks in accordance with an exemplary embodiment is shown. As illustrated at block 600, the method includes grouping the plurality of register banks into a two-dimensional array. As shown at block 602, the method includes adding a first error control mechanism to the array configured to detect or correct errors that occur in a first direction. As shown at block 604, the method includes adding a second error control mechanism to the array configured to detect or correct errors that occur in a second direction. As shown at block 606, the method includes adding a product code to the array configured to apply the second error control mechanism to a plurality of bits of the first error control mechanism.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for adding error detection, or error detection combined with error correction, to a plurality of register banks on an integrated circuit, the method comprising:
   grouping the plurality of register banks on the integrated circuit into an array, wherein each of the plurality of register banks comprises a plurality of registers and wherein each of the plurality of registers comprises a length and a width;
   adding a first error control mechanism to the array in a first direction, wherein the first direction is a direction perpendicular to the widths of the registers;
   adding a second error control mechanism to the array in a second direction; and
   adding a product code to the array, wherein the product code comprises applying the second error control mechanism to a plurality of bits of the first error control mechanism,
   wherein one or more bits of the first error control mechanism and one or more bits of the second error control mechanism are disposed in a free space on the integrated circuit disposed between two or more of the plurality of register banks.

2. The method of claim 1, wherein the first error control mechanism is a parity protection bit.

3. The method of claim 2, wherein the second error control mechanism is a parity protection bit.

4. The method of claim 1, wherein a Hamming distance of the second error control mechanism is greater than or equal to a Hamming distance of the first error control mechanism.

5. A computer system for providing error detection, or error detection combined with error correction, to a plurality of register banks on an integrated circuit, the computer system comprising a processor, the computer system configured to perform a method comprising:
   grouping the plurality of register banks on the integrated circuit into an array, wherein each of the plurality of register banks comprises a plurality of registers and wherein each of the plurality of registers comprises a length and a width;
   adding a first error control mechanism to the array in a first direction, wherein the first direction is a direction perpendicular to the widths of the registers;
   adding a second error control mechanism to the array in a second direction; and
   adding a product code to the array, wherein the product code comprises applying the second error control mechanism to a plurality of bits of the first error control mechanism,
   wherein one or more bits of the first error control mechanism and one or more bits of the second error control mechanism are disposed in a free space on the integrated circuit disposed between two or more of the plurality of register banks.

6. The computer system of claim 5, wherein the first error control mechanism is a parity protection bit.

7. The computer system of claim 6, wherein the second error control mechanism is a parity protection bit.

8. The computer system of claim 5, wherein a Hamming distance of the second error control mechanism is greater than or equal to a Hamming distance of the first error control mechanism.

9. A system comprising:
   a plurality of register banks on an integrated circuit grouped in an array, wherein each register bank further comprises a plurality of registers and wherein each of the plurality of registers comprises a length and a width;
   a first error control mechanism configured to detect errors in the array in a first direction, wherein the first direction is a direction perpendicular to the widths of the registers;
   a second error control mechanism configured to detect errors in the array in a second direction; and
   a product code configured to apply the second error control mechanism to a plurality of bits of the first error control mechanism,
   wherein one or more bits of the first error control mechanism and one or more bits of the second error control mechanism are disposed in a free space on the integrated circuit disposed between two or more of the plurality of register banks.

10. The system of claim 9, wherein the first error control mechanism is a parity protection bit.

11. The system of claim 9, wherein a Hamming distance of the second error control mechanism is greater than or equal to a Hamming distance of the first error control mechanism.

* * * * *